United States Patent
Shibasaki et al.

(10) Patent No.: US 9,191,187 B2
(45) Date of Patent: Nov. 17, 2015

(54) RECEPTION CIRCUIT AND SEMICONDUCTOR INTEGRATED CIRCUIT

(71) Applicant: FUJITSU LIMITED, Kawasaki-shi, Kanagawa (JP)

(72) Inventors: Takayuki Shibasaki, Kawasaki (JP); Hirotaka Tamura, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 33 days.

(21) Appl. No.: 14/136,656

(22) Filed: Dec. 20, 2013

(65) Prior Publication Data

US 2014/0286469 A1 Sep. 25, 2014

(30) Foreign Application Priority Data

Mar. 25, 2013 (JP) ................................. 2013-061286

(51) Int. Cl.
| | |
|---|---|
| *H04L 7/02* | (2006.01) |
| *H04L 7/00* | (2006.01) |
| *H03L 7/00* | (2006.01) |
| *H04L 7/033* | (2006.01) |

(52) U.S. Cl.
CPC ................ *H04L 7/0079* (2013.01); *H03L 7/00* (2013.01); *H04L 7/033* (2013.01); *H04L 7/0004* (2013.01); *H04L 7/0037* (2013.01); *H04L 7/0337* (2013.01)

(58) Field of Classification Search
CPC ..... H04L 7/0331; H04L 7/033; H04L 7/0338; H04L 7/0066; H04L 7/0337
USPC .................................................. 375/354–376
See application file for complete search history.

(56) References Cited

U.S. PATENT DOCUMENTS

| | | | | |
|---|---|---|---|---|
| 5,237,290 A | * | 8/1993 | Banu et al. ......................... | 331/2 |
| 5,418,496 A | * | 5/1995 | Ford et al. .......................... | 331/2 |
| 5,834,980 A | * | 11/1998 | Pitio et al. .......................... | 331/2 |
| 5,920,600 A | * | 7/1999 | Yamaoka et al. ............. | 375/376 |
| 7,965,800 B2 | * | 6/2011 | Sugawara et al. ............. | 375/354 |
| 8,019,022 B2 | * | 9/2011 | Liu et al. ....................... | 375/326 |
| 2004/0046596 A1 | * | 3/2004 | Kaeriyama et al. ........... | 327/165 |
| 2005/0218999 A1 | * | 10/2005 | Jasa et al. ......................... | 331/16 |
| 2006/0140309 A1 | * | 6/2006 | Kuo et al. ...................... | 375/326 |
| 2007/0081619 A1 | * | 4/2007 | Kuo et al. ...................... | 375/371 |
| 2008/0260087 A1 | * | 10/2008 | Liang et al. .................... | 375/376 |
| 2010/0104057 A1 | * | 4/2010 | Nedovic et al. ............... | 375/360 |
| 2010/0164575 A1 | * | 7/2010 | Suzuki et al. .................. | 327/159 |
| 2010/0182056 A1 | * | 7/2010 | Liang et al. .................... | 327/155 |
| 2013/0120036 A1 | * | 5/2013 | Zhu et al. ....................... | 327/156 |

(Continued)

FOREIGN PATENT DOCUMENTS

| | | |
|---|---|---|
| JP | H03-062730 A | 3/1991 |
| JP | 2012-085142 A | 4/2012 |

*Primary Examiner* — James M Perez
(74) *Attorney, Agent, or Firm* — Fujitsu Patent Center (57) ABSTRACT

A burst mode CDR detects an edge from a data signal superimposed with a clock, and generates a recovered clock by means of a voltage controlled oscillator whose oscillation operation is reset based on a timing when the edge is detected. A phase adjustment unit adjusts the phase of a data signal so as to coincide with the phase of a recovered clock. A PLL-based CDR adjusts the oscillation frequency of the recovered clock by means of the voltage controlled oscillator, based on a phase difference between a data signal whose phase has been adjusted by the phase adjustment unit and a feedback clock from the voltage controlled oscillator. A determination unit determines the value of the data signal at a timing when the signal level of the recovered clock transitions.

3 Claims, 9 Drawing Sheets

(56) References Cited

U.S. PATENT DOCUMENTS

| | | | |
|---|---|---|---|
| 2013/0141145 A1* | 6/2013 | Yu et al. | 327/157 |
| 2013/0169326 A1* | 7/2013 | Yu et al. | 327/155 |
| 2013/0216003 A1* | 8/2013 | Zhuang et al. | 375/316 |
| 2013/0294464 A1* | 11/2013 | Katsurai et al. | 370/516 |
| 2014/0064423 A1* | 3/2014 | Chen et al. | 375/374 |
| 2014/0240157 A1* | 8/2014 | Noh et al. | 341/155 |

* cited by examiner

RECEPTION CIRCUIT AND SEMICONDUCTOR INTEGRATED CIRCUIT

CROSS-REFERENCE TO RELATED APPLICATION

This application is based upon and claims the benefit of priority of the prior Japanese Patent Application No. 2013-061286, filed on Mar. 25, 2013, the entire contents of which are incorporated herein by reference.

FIELD

The embodiments disclosed herein relate to a reception circuit and a semiconductor integrated circuit.

BACKGROUND

As the performance of information processing apparatuses, such as apparatuses and servers for the communication infrastructure, improves, the data rate of signal transmission/reception inside and outside the apparatuses increases.

As a reception circuit, there is known a reception circuit having a function (CDR: Clock and Data Recovery) to receive a data signal superimposed with a clock, determine the data signal at an appropriate timing, and recover data and the clock.

Because the clock is not yet recovered immediately at start data signal input, the reception circuit may not determine the data at an appropriate timing and thus will generate an error in output data. A time period from the start of data signal input until the output data has no error is called a look time of the CDR. As the performance of the CDR, the shorter the lock time, the more preferable the lock time is. In applications that perform burst transmission, it is particularly important to shorten the lock time.

The examples of the CDR include a burst mode CDR and a PLL (Phase Locked Loop)-based CDR.

The burst mode CDR, upon detection of an edge from a data signal, resets an oscillation of a VCO (Voltage Controller Oscillator) so as to cause the phase of a clock (recovered clock) output from the VCO to coincide with the phase of the data signal (for example, see Japanese Laid-open Patent Publication No. 2012-85142). In the burst mode CDR, because the recovered clock will synchronize with the data signal immediately after an edge of the data signal is detected, the lock time is short. However, in the burst mode CDR, the jitter of the data signal is applied to the recovered clock. In the burst mode CDR, because there is no correlation between the jitter of the data signal and the jitter of the recovered clock (asynchronous jitter), the effect of the jitter is large and the characteristics of the burst mode CDR will degrade.

On the other hand, the PLL-based CDR detects a phase difference between a data signal and a recovered clock and varies the oscillation frequency of a VCO in response to the phase difference, thereby causing the phase of the recovered clock to coincide with the phase of the data signal (for example, see Japanese Laid-open Patent Publication No. 03-62730). The PLL-based CDR includes a loop filter for suppressing high frequency noise, and thus has few problems of jitter unlike the burst mode CDR. However, in the PLL-based CDR, frequency synchronization between a data signal that is input during an initial operation and a recovered clock takes a relatively long time, a tracking error is generated, and the lock time is increased.

If the CDR is simply switched to the PLL-based CDR after an initial operation in the burst mode CDR, in order to shorten the lock time while suppressing the effect of the jitter, then the phase of a clock shifts during the transition, a tracking error is generated, and frequency synchronization may not be established.

SUMMARY

According to an aspect of the embodiments disclosed herein, there is provided a reception circuit including: a first clock recovery unit that detects an edge from a data signal superimposed with a clock and generates a recovered clock by means of a voltage controlled oscillator whose oscillation operation is reset based on a timing when the edge is detected; a phase adjustment unit that adjusts a phase of the data signal so as to coincide with a phase of the recovered clock; a second clock recovery unit that, based on a phase difference between a data signal whose phase has been adjusted by the phase adjustment unit and a feedback clock from the voltage controlled oscillator, adjusts an oscillation frequency of the recovered clock by means of the voltage controlled oscillator; and a determination unit that determines a value of the data signal at a timing when a signal level of the recovered clock transitions.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Several embodiments will be described below with reference to the accompanying drawings, wherein like reference numerals refer to like elements throughout.

First Embodiment

Figure 1:
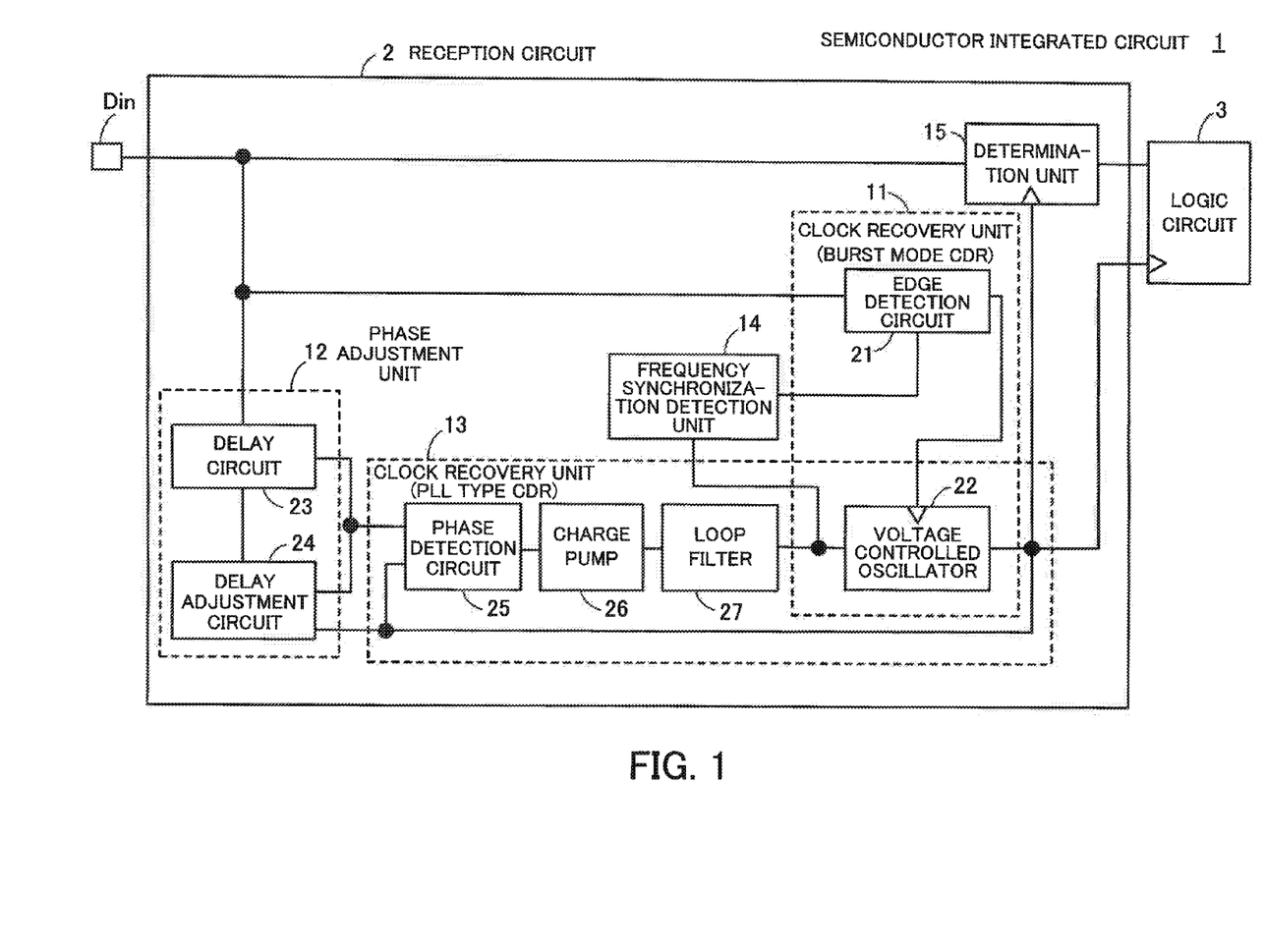
FIG. 1 illustrates an example of a semiconductor integrated circuit and a reception circuit of a first embodiment.

FIG. 1 illustrates an example of a semiconductor integrated circuit and a reception circuit of a first embodiment.

A semiconductor integrated circuit 1 includes a reception circuit 2 and a logic circuit 3.

The reception circuit 2 includes a clock recovery unit 11 (hereinafter, referred to as a burst mode CDR 11), a phase adjustment unit 12, a clock recovery unit 13 (hereinafter, referred to as a PLL-based CDR 13), a frequency synchronization detection unit 14, and a determination unit 15.

The burst mode CDR 11 detects, from a data signal superimposed with a clock, an edge (a portion at which the signal level of the data signal transitions). The burst mode CDR 11 then generates a recovered clock by means of a voltage controlled oscillator 22 whose oscillation operation is reset based on a timing when the edge is detected.

The burst mode CDR 11 includes en edge detection circuit 21 and the voltage controlled oscillator 22. The edge detection circuit 21, upon detection of an edge from a data signal input from a data input terminal Din, generates a reset signal to reset the oscillation operation of the voltage controlled oscillator 22. The resetting the oscillation operation implies, in this specification, forcibly causing the signal level of a recovered clock to transition (e.g., to rise from "0" to "1").

Thus, the clock (recovered clock) output from the voltage controlled oscillator 22 and the data signal will synchronize with each other at high speed.

The phase adjustment unit 12 adjusts the phase of the data signal so as to coincide with the phase of a recovered clock generated by the operation of the burst mode CDR 11. In the example of FIG. 1, the phase adjustment unit 12 includes a delay circuit 23 and a delay adjustment circuit 24.

The delay circuit 23 varies the phase of the data signal by delaying the data signal by a delay amount adjusted by the delay adjustment circuit 24.

The delay adjustment circuit 24 adjusts delay amount of the delay circuit 23 in advance based on the delay amount of the burst mode CDR 11.

The PLL-based CDR 13 generates a recovered clock whose oscillation frequency has been adjusted by the voltage controlled oscillator 22, based on a phase difference between a data signal whose phase has been adjusted by the phase adjustment unit 12 and a feedback clock from the voltage controlled oscillator 22.

The PLL-based CDR 13 includes a phase detection circuit 25, a charge pump 26, a loop filter 27, and the above-described voltage controlled oscillator 22. The voltage controlled oscillator 22 is shared with the burst mode CDR 11.

The phase detection circuit 25 detects a phase difference between the data signal whose phase has been adjusted by the phase adjustment unit 12 and the feedback clock from the voltage controlled oscillator 22. The charge pump 26 generates an analog output current in an amount corresponding to this phase difference. The loop filter 27 is a low pass filter, cuts off the noise of a high frequency component of the output current of the charge pump 26, and generates a control voltage. The voltage controlled oscillator 22 varies the oscillation frequency in response to the control voltage.

The frequency synchronization detection unit 14 detects a fluctuation amount in the control voltage that is output from the loop filter 27 the voltage controlled oscillator 22, and determines whether or not the recovered clock is frequency-synchronized with the phase-adjusted data signal. The frequency synchronization detection unit 14, when determining that the fluctuation amount in the control voltage is smaller than a predetermined value and that frequency synchronization has been established, stops an operation to reset the voltage controlled oscillator 22 performed by the burst mode CDR 11.

The determination unit 15 determines the value of a data signal that is input from the data input terminal Din at a timing of the recovered clock that is output from the voltage controlled oscillator 22.

Hereinafter, the operation of the semiconductor integrated circuit 1 and the reception circuit 2 of the first embodiment is described.

First, in the phase adjustment unit 12, phase (delay) adjustment is performed so that the phase of a recovered clock generated by the burst mode CDR 11 and the phase of a data signal coincide with each other. While the detail of the phase adjustment is described later, the delay adjustment circuit 24 adjusts the delay amount of the delay circuit 23 so as to coincide with the delay amount in the edge detection circuit 21 and the voltage controlled oscillator 22 of the burst mode CDR 11. Thus, a phase shift between a recovered clock that is generated when clock recovery is performed by the burst mode CDR 11 and a data signal that is input to the phase detection circuit 25 may be reduced.

Subsequently, an initial operation is performed.

During the initial operation, the edge detection circuit 21, upon detection of an edge of a data signal, generates a reset signal to reset the voltage controlled oscillator 22. Thus, the data signal and the recovered clock output from the voltage controlled oscillator 22 synchronize with each other immediately. The determination unit 15 compares the value of the data signal with a predetermined threshold value at the timing of the recovered clock and outputs data corresponding to the comparison result. The recovered clock and the data output from the determination unit 15 are input to the logic circuit 3, where a predetermined operation is performed.

Note that, during the initial operation, the PLL-based CDR 13 also operates. The recovered clock output from the voltage controlled oscillator 22 is input to the phase detection circuit 25 of the PLL-based CDR 13 as a feedback clock. The data signal whose phase has been adjusted by the above-described phase adjustment operation is input also to the phase detection circuit 25. The phase detection circuit 25 then detects a phase difference between the phase-adjusted data signal and the feedback clock from the voltage controlled oscillator 22. The charge pump 26 generates an analog output current in an corresponding to this phase difference, and the loop filter 27 generates a control voltage. The voltage controlled oscillator 22 varies the oscillation frequency in response to the control voltage.

During the initial operation, the frequency synchronization detection unit 14 determines, from a fluctuation amount in the control voltage output from the loop filter 27, whether or not the recovered clock is frequency-synchronized with the phase-adjusted data signal. The frequency synchronization detection unit 14, when determining that the frequency synchronization has been established, outputs a signal for stopping the operation of the edge detection circuit 21. Thus, the operation of the burst mode CDR 11 is stopped, and the reception circuit 2 transitions to the normal operation performed by the PLL-based CDR 13.

During the operation of the burst mode CDR 11, the feedback clock that is input to the phase detection circuit 25 from the voltage controlled oscillator 22 shifts relative to the phase of the data signal due to a delay caused by the edge detection circuit 21, the voltage controlled oscillator 22, and the like. Using the data signal, whose phase has been adjusted so as to coincide with the phase of the feedback clock output from the voltage controlled oscillator 22 that is reset by the burst mode CDR 11, the reception circuit 2 of the embodiment performs clock recovery by means of the PLL-based CDR 13. Thus, the phase detection circuit 25 may properly detect a phase, and a tracking error in transitioning from the processing of the burst mode CDR 11 to the processing of the PLL-based CDR 13 may be eliminated.

Moreover, the delay amount caused by the edge detection circuit 21, the voltage controlled oscillator 22, and the like differs depending on a manufacturing variation and the like, and therefore by the delay adjustment circuit 24 adjusting the delay amount to an appropriate value, frequency synchronization between a recovered clock and a data signal may be accurately established.

Moreover, by recovering the clock by means of the burst mode CDR 11 at the beginning, it is possible to shorten the lock time and subsequently by recovering the clock by means of the PLL-based CDR 13, it is possible to suppress also the effect of jitter. Thus, the occurrence of out-of-synchronization in the logic circuit 3 at the subsequent stage may be prevented. For this reason, the CDR operable at a high data rate may be realized.

Moreover, by providing the frequency synchronization detection unit 14 and by stopping the operation of the burst mode CDR 11 when the frequency synchronization has been established by means of the PLL-based CDR 13, it is possible to reduce the power consumption of the reception circuit 2. Note that, instead of the frequency synchronization detection unit 14, a circuit may be provided, which for example, after a predetermined time, stops the operation of the edge detection circuit 21 so as to stop the operation of the burst mode CDR 11.

Second Embodiment

Figure 2:
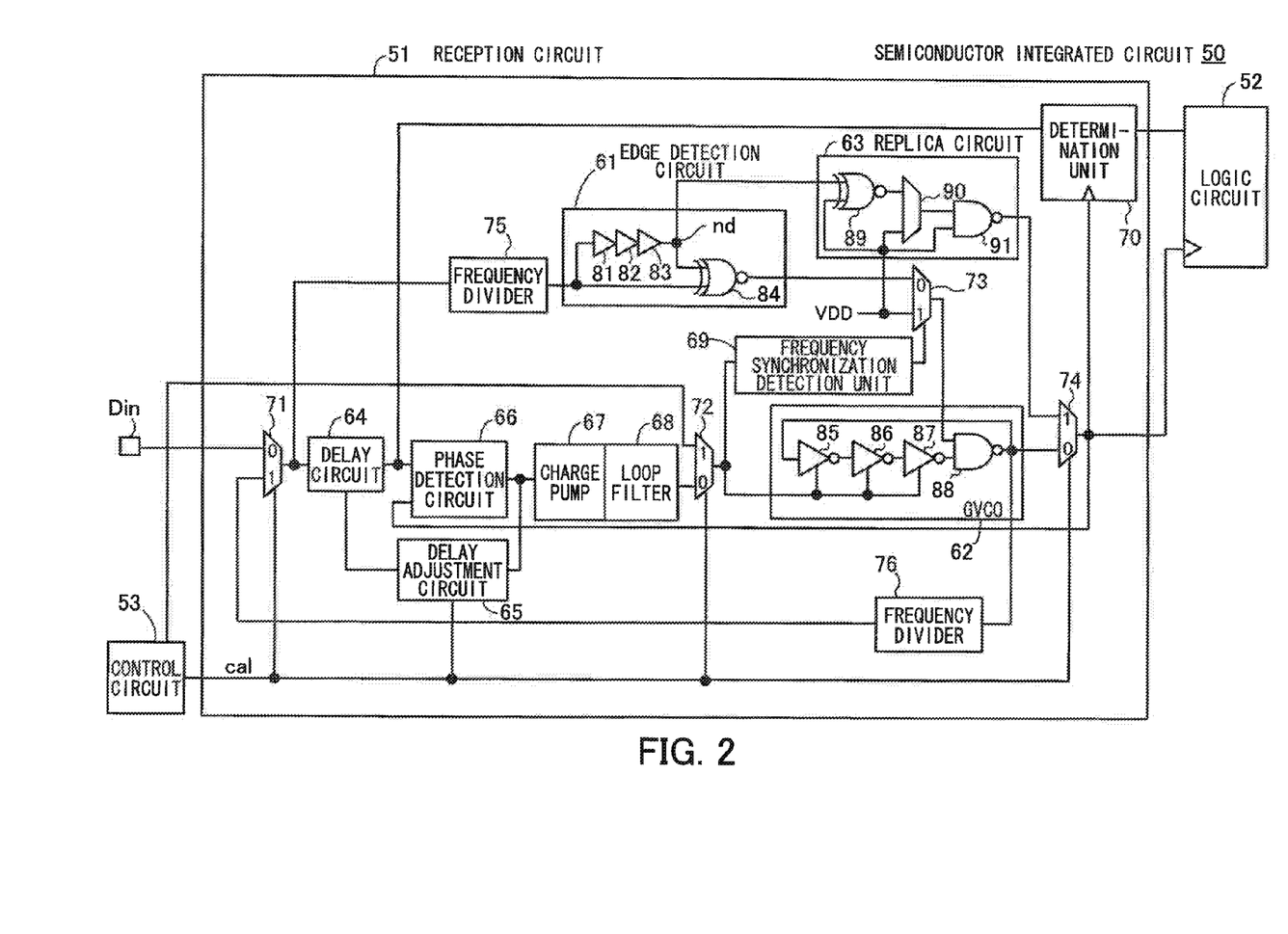
FIG. 2 illustrates an example of a semiconductor integrated circuit and a reception circuit of a second embodiment.

FIG. 2 illustrates an example of a semiconductor integrated circuit and a reception circuit of a second embodiment.

A semiconductor integrated circuit 50 includes a reception circuit 51, a logic circuit 52, and a control circuit 53.

The reception circuit 51 includes an edge detection circuit 61, a GVCO (gated VCO) 62, a replica circuit 63, a delay circuit 64, a delay adjustment circuit 65, a phase detection circuit 66, a charge pump 67, a loop filter 68, a frequency synchronization detection unit 69, and a determination unit 70. Furthermore, the reception circuit 51 includes selectors 71, 72, 73, and 74 and frequency dividers 75 and 76.

The edge detection circuit 61 includes buffer circuits 81, 82, and 83 and an ExNOR circuit 84. An output signal of the frequency divider 75 is input to one input terminal of the ExNOR circuit 84, and an output signal of the frequency divider 75 delayed by the buffer circuits 81 to 83 is input to the other input terminal. Such an edge detection circuit 61 outputs "0" during transition of input data. Note that the number of stages of the buffer circuits 81 to 83 is not limited to three.

The GVCO 62 has the function of the voltage controlled oscillator 22 illustrated in FIG. 1. The GVCO 62 includes, for example, inverters 85, 86, and 87 and a NAND circuit 88 connected in series as illustrated in FIG. 2. An output signal of the selector 73 is input to one input terminal of the NAND circuit 88, and an output signal of the NAND circuit 88 is input to the other input terminal via the inverters 85 to 87. The inverters 85 to 87 are controlled by an output signal (control voltage) from the selector 72. In such a GVCO 62, when the output signal of the selector 73 becomes "0", the output of the GVCO 62 is reset.

The replica circuit 65 includes an ExNOR circuit 89, a selector 90, and a NAND circuit 91. The replica circuit 83 is used in delay adjustment in the delay circuit 64 and the delay adjustment circuit 65. For the ExNOR circuit 89, the same element as the element of the ExNOR circuit 84 of the edge detection circuit 61 is used. For the selector 90, the same element as the element of the selector 73 is used. For the NAND circuit 91, the care element as the element of the NAND circuit 88 of the GVCO 62 is used. That is, the replica circuit 63 is a replica of a circuit from a node nd of the edge detection circuit 61 to the output of the GVCO 62. The replica circuit 63 is used during delay adjustment.

The output signal from the frequency divider 75 is input to one input terminal of the ExNOR circuit 89 via the buffer circuits 81 to 83, and a power supply voltage VDD is applied to the other input terminal. The output signal of the ExNOR circuit 89 is input to one input terminal of the selector 90, and the power supply voltage VDD is applied to the other input terminal. The output signal of the selector 90 is input to one input terminal of the NAND circuit 91, and the power supply voltage VDD is applied to the other input terminal.

The delay circuit 64 delays the output signal of the selector 71 by a delay amount set by the delay adjustment circuit 65. The delay adjustment circuit 65 adjusts the delay amount based on a phase detection result in the phase detection circuit 66.

The phase detection circuit 66 detects a phase difference between the output signal of the delay circuit 64 and the output signal of the selector 74. The charge pump 67 generates an analog output current in an amount corresponding to this phase difference. The loop filter 68 is a low pass filter, cuts off the noise of high frequency components of the output current of the charge pump 67, and generates a control voltage.

The frequency synchronization detection unit 69 detects a fluctuation amount in the control voltage that is output from the selector 72 to the GVCO 62, and determines whether or not the phase of the feedback clock coincides with the phase of the phase-adjusted data signal. The frequency synchronization detection unit 69, when determining that the fluctuation amount in the control voltage is smaller than a predetermined value and that frequency synchronization has been achieved, supplies a selection signal for selecting and outputting the power supply voltage VDD to the selector 73.

At a timing of the recovered clock output from the selector 74, the determination unit 70 determines the value of the data signal delayed by the delay circuit 64. Then, the determination unit 70 supplies the determined value of the data to the logic circuit 52. The logic circuit 52 acquires this data at a timing of the clock recovered by the reception circuit 51.

In accordance with a control signal cal from the control circuit 53, the selector 71 selects either of a data signal input from the data input terminal Din or a signal input via a frequency divider 76 from the GVCO 62. In the following description, assume that the control signal cal "1" during the delay adjustment, and is "0" during the initial operation and during the normal operation. When the value of the control signal cal is "0", the selector 71 outputs the data signal, while when it is "1", the selector 71 outputs a signal that is input via the frequency divider 76 from the GVCO 62.

In accordance with the control signal cal from the control circuit 53, the selector 72 selects and outputs either of a control voltage (of a fixed value) for delay adjustment supplied from the control circuit 53 or a control voltage that is output from the loop filter 68. During the delay adjustment, the selector 72 receives "1" from the control circuit 53 as the control signal cal, and outputs the control voltage for delay adjustment supplied from the control circuit 53. During the initial operation and during the normal operation, the selector 72 receives "0" from the control circuit 53 as the control signal cal, and selects and outputs the control voltage that is output from the loop filter 68.

In accordance with the selection signal from the frequency synchronization detection unit 69, the selector 73 selects and outputs either of the output signal of the edge detection circuit 61 or the power supply voltage VDD. For example, the selector 73, when having received. "0" from the frequency synchronization detection unit 69 as the selection signal, selects and outputs the output signal of the edge detection circuit 61, and when having received "1", selects and outputs the power supply voltage VDD.

In accordance with the control signal cal from the control circuit 53, the selector 74 selects and outputs either of the output signal of the replica circuit 63 or the output signal of the GVCO 62. During the delay adjustment, the selector 74, when having received "1" from the control circuit 53 as the control signal cal, selects and outputs the output signal of the replica circuit 63. During the initial operation and during the normal operation, the selector 74, when having received "0" from the control circuit 53 as the control signal cal, selects and outputs the output signal of the GVCO 62.

The frequency divider 75 reduces toe data rate of the output signal of the selector 71. The frequency divider 76 reduces the data rate of the GVCO 62. Thus, the power consumption the reception circuit 51 may be reduced. Note that a path from the output of the GVCO 62 to the selector 71 via the frequency divider 76 is the path selected during the delay adjustment.

In such a reception circuit 51, the edge detection circuit 61 and the GVCO 62 operate, and the selector 73 selects the output signal of the edge detection circuit 61 and supplies the same to the GVCO 62, thereby performing the function of the burst mode CDR 11 as illustrated in FIG. 1. Moreover, when the phase detection circuit 66, the charge pump 67, the loop filter 68, and the GVCO 62 operate and the control signal cal supplied to the selectors 71, 72 and 74 is "0", the function of the PLL-based CDR 13 illustrated in FIG. 1 is performed. Note that, in the example of FIG. 2, an analog PLL-based CDR is illustrated, but a digital PLL-based CDR may be used.

When the control signal cal supplied to the selectors 71, 72 and 74 is "1", the function of the phase adjustment unit 12 illustrated FIG. 1 is performed using the replica circuit 63, the delay circuit 64, and the delay adjustment circuit 65. Hereinafter, two delay circuits 64a and 64b are described as an example of the delay circuit 64.

Figure 3:
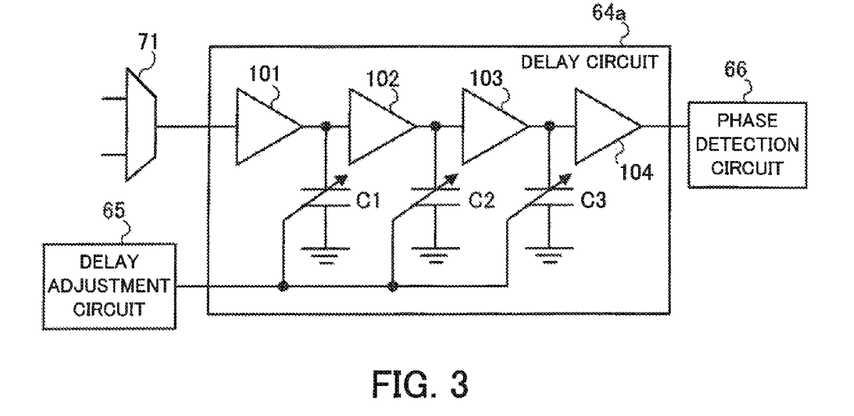
FIG. 3 illustrates an example of a delay circuit.

FIG. 3 illustrates an example of the delay circuit.

The delay circuit 64a includes a plurality of stages of butter circuits 101, 102, 103, and 104 connected in series and variable capacitors C1, C2 and C3. One terminals of the variable capacitors C1 to C3 are connected to the output terminals of the buffer circuits 101 to 103, respectively. The other terminals of the variable capacitors C1 to C3 are grounded. For the variable capacitors C1 to C3, the capacitance values thereof are varied according to a delay code from the delay adjustment circuit 65 and accordingly the delay amount of the delay circuit 64a is adjusted.

Note that the delay amount may be adjusted by varying the values of the variable capacitors C1 to C3 in an analog manner by a control voltage or may be adjusted by digitally controlling the number of the variable capacitors C1 to C3 to be used.

Figure 4:
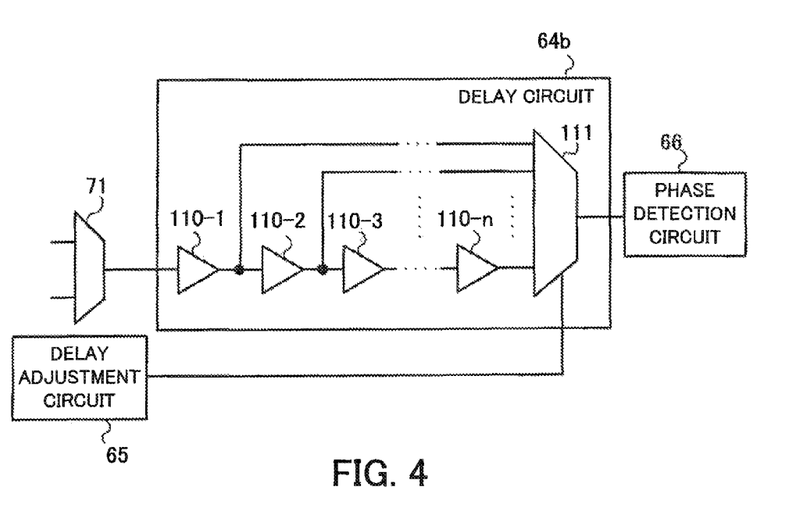
FIG. 4 illustrates another example of the delay circuit.

FIG. 4 illustrates another example of the delay circuit.

The delay circuit 64b includes a plurality of stages of buffer circuits 110-1, 110-2, 110-3, . . . , and 110-n connected in series and a selector 111. Each input terminal of the selector 111 is connected to each output terminal of the buffer circuits 110-1 to 110-n. A delay code from the delay adjustment circuit 65 is input to the selector 111, and the number of stages of the buffer circuits 110-1 to 110-n, through which the output signal of the selector 71 passes, is switched in accordance with the delay code, and thus the delay amount is adjusted.

Hereinafter, the operation of the semiconductor integrated circuit 50 and the reception circuit 51 is described.

Figure 5:
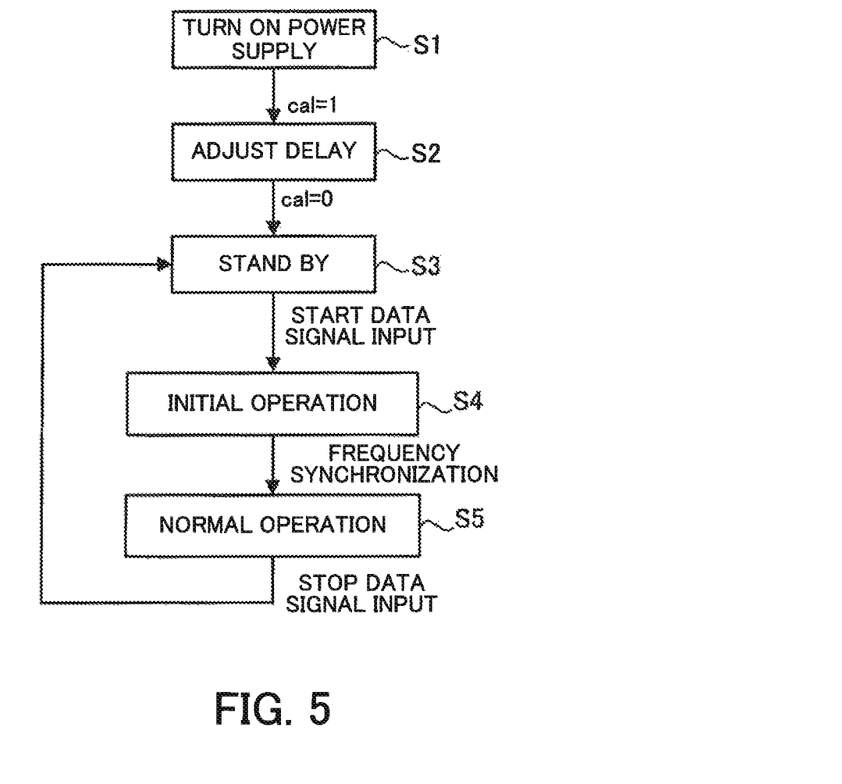
FIG. 5 is a flow chart illustrating an exemplary flow of the operation of the semiconductor integrated circuit and the reception circuit.
Figure 6:
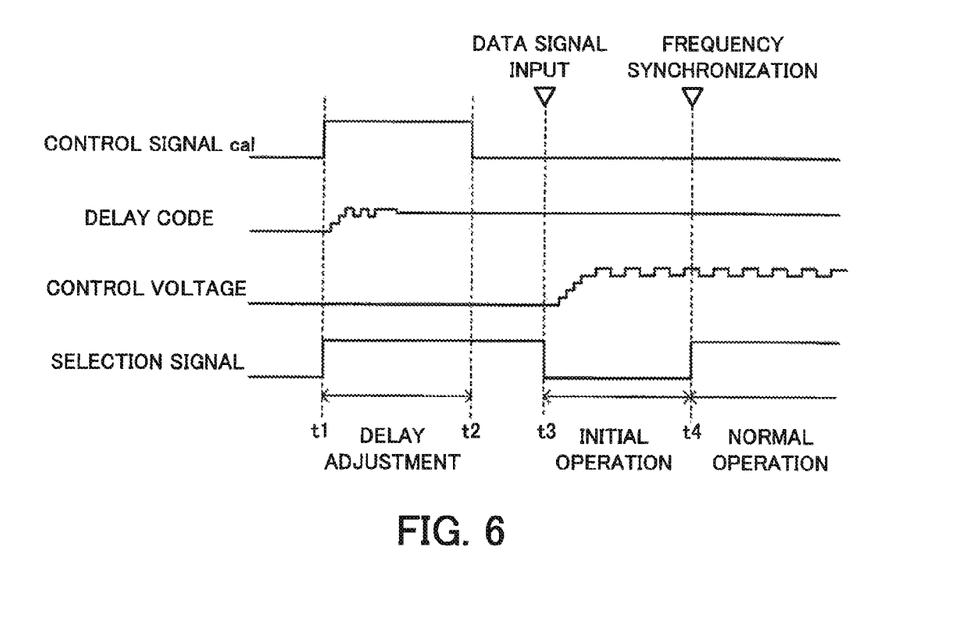
FIG. 6 is a timing chart illustrating an example of a signal of each part during the operation of the semiconductor integrated circuit and the reception circuit.

FIG. 5 is a flow chart illustrating an exemplary flow of the operation of the semiconductor integrated circuit and the reception circuit. FIG. 6 is a timing chart illustrating an example or a signal of each part during the operation of the semiconductor integrated circuit and the reception circuit. FIG. 6 illustrates the states of the control signal cal output from the control circuit 53, the delay code output from the delay adjustment circuit 65, the control voltage output from the loop filter 68, and the selection signal output from the frequency synchronization detection unit 69.

Upon turning on of the power supply of the reception circuit 51 (Step S1), the control circuit 53 sets the control signal cal to "1" (at a timing t1) to cause the reception circuit 51 to perform the delay adjustment operation (Step S2). At this timing, the selection signal output from the frequency synchronization detection unit 69 becomes "1". Upon completion of the setting of a delay code and completion of the delay adjustment, the control circuit 53 sets the control signal cal to 0 (at a timing t2) and thus the reception circuit 51 enters a standby state (Step S3).

Upon start of data signal input to the reception circuit 51 (at a timing t3), the reception circuit 51 performs the initial operation (Step S4). When the frequency synchronization detection unit 69 detects that the fluctuation amount in the control voltage falls below a predetermined value one to the initial operation and that the frequency synchronization has been established, the frequency synchronization detection unit 69 seta the selection signal to "1" (at a timing t4), and the normal operation is performed (Step S5). When the data signal input is stopped during the normal operation, the reception circuit 51 returns to a standby state, again. Note that, during the above-described each processing, for example, when the power supply of the semiconductor integrated circuit 50 is turned off, the operation of the semiconductor integrated circuit 50 and the reception circuit 51 is ended.

Next, an example of each of the delay adjustment operation, the initial operation, and the normal operation illustrated in FIG. 5 and FIG. 6 is described.

(Delay Adjustment Operation)

Figure 7:
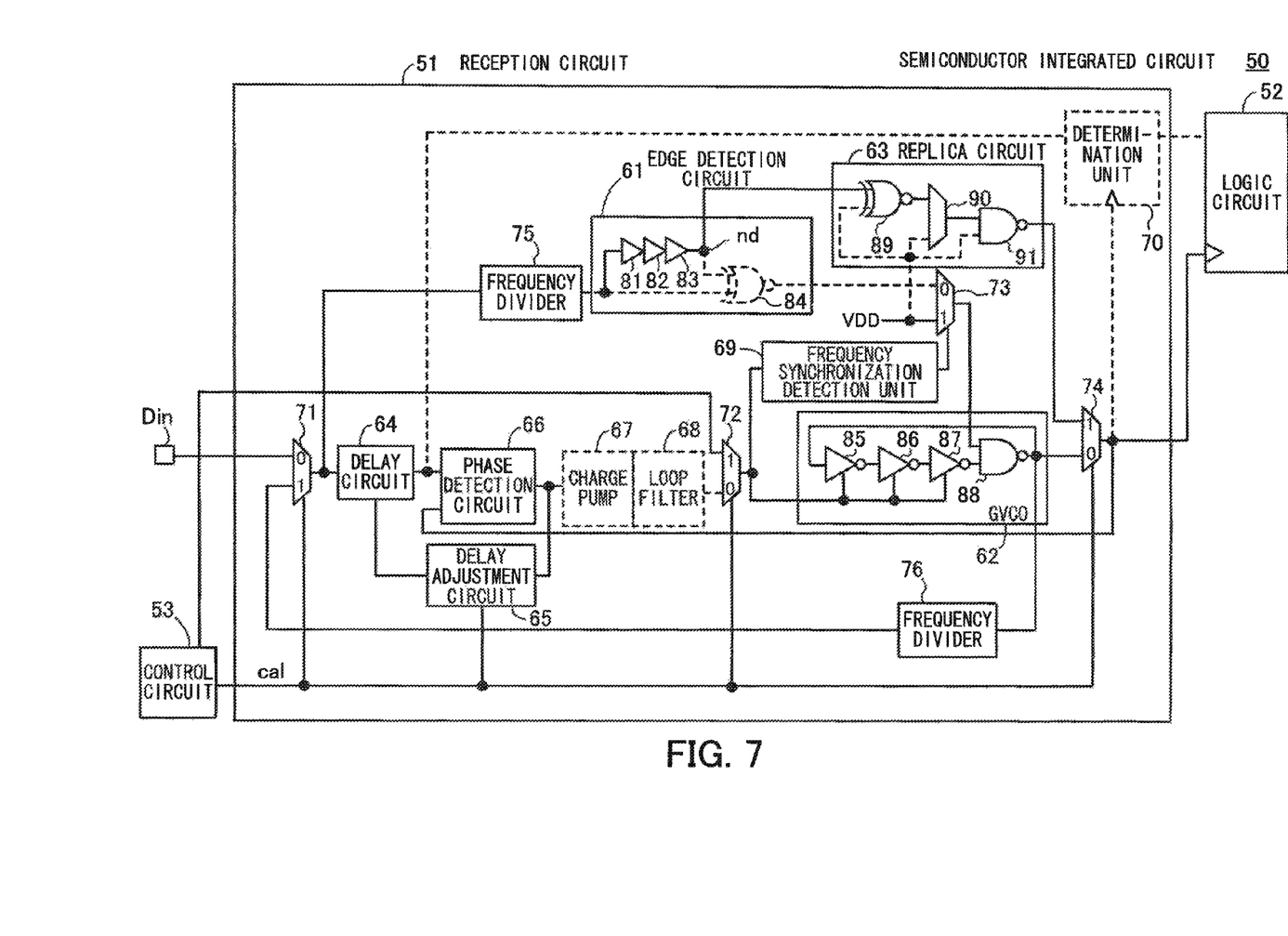
FIG. 7 illustrates an example of a delay adjustment operation.

FIG. 7 illustrates an example of the delay adjustment operation. In FIG. 7, elements or paths, which are not used (which are not selected) in the delay adjustment operation in the reception circuit 51 illustrated in FIG. 2, are indicated by a dashed line.

The delay adjustment is performed so that a delay in a path from the selector 71 to the phase detection circuit 66 via the frequency divider 75, the buffer circuits 81 to 83, the replica circuit 63, and the selector 74 coincides with a delay in a path from the selector 71 to the phase detection circuit 66 via the delay circuit 64. Therefore, the paths in the selectors 71, 72 and 74 are switched by the control signal cal.

Note that, during the delay adjustment operation, the frequency synchronization detection unit 69 outputs to selection signal "1" for causing the selector 73 to select the power supply voltage VDD. Moreover, the control voltage for the GVCO 62 becomes a fixed value for delay adjustment supplied from the control circuit 53. A timing signal generated in the GVCO 62 by this fixed value is output from the selector 71 via the frequency divider 76.

The phase detection circuit 66 detects a phase difference between the both paths, and the delay adjustment circuit 65 sets a delay code to the delay circuit 64 and adjusts the delay amount so that the phase difference between the both paths becomes 0. Upon completion of the delay adjustment, the control circuit 53 sets the control signal cal to "0".

(Initial Operation)

Figure 8:
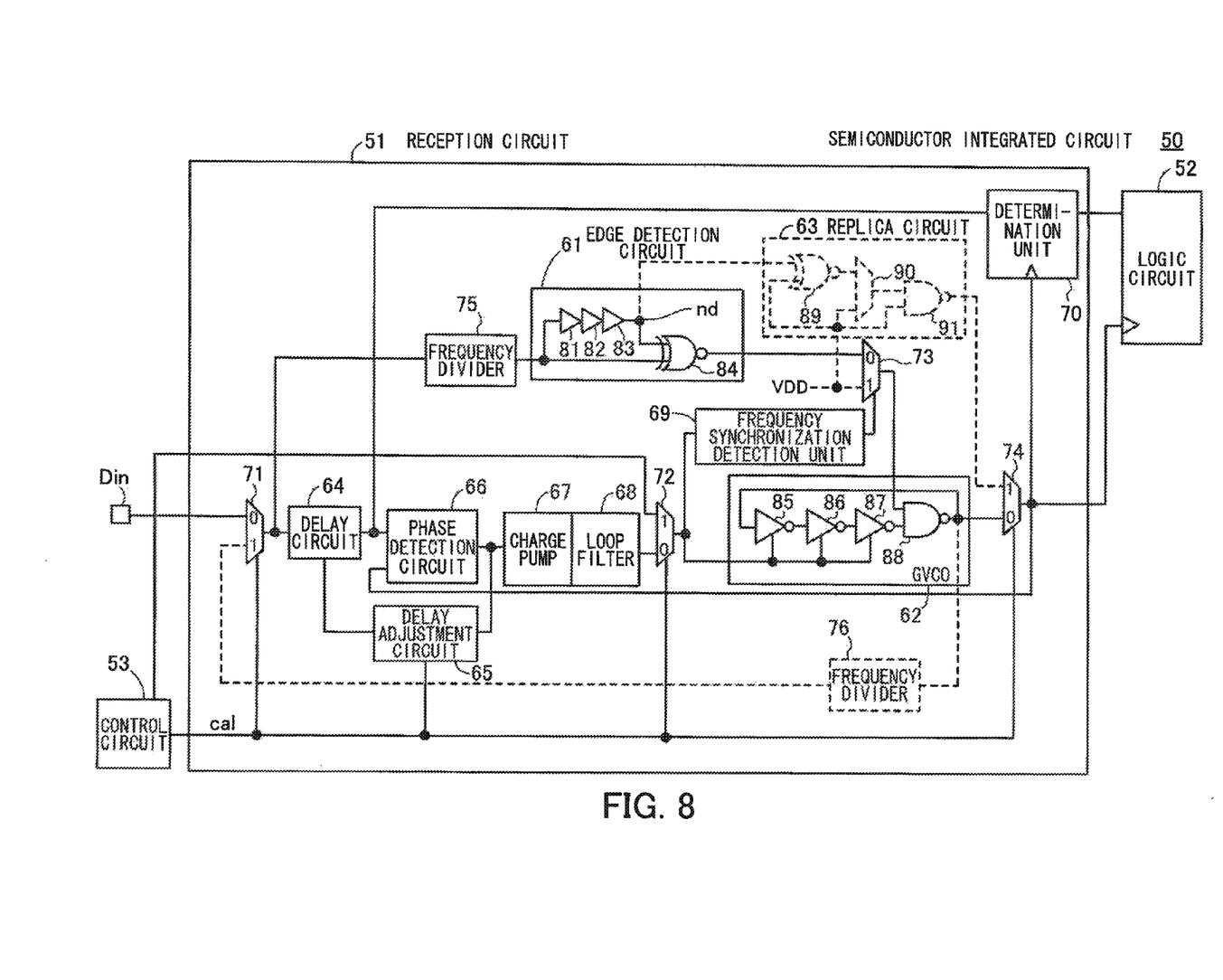
FIG. 8 illustrates an example of an initial operation.

FIG. 8 illustrates en example of the initial operation. In FIG. 8, elements or paths, which are not used (which are not selected) in the initial operation in the reception circuit 51 illustrated in FIG. 2, are indicated by a dashed line.

During the initial operation, the selector 72 outputs the control voltage supplied from the loop filter 68 because the control signal cal set to "0". Immediately after start of data signal input, the frequency synchronization detection unit 69 outputs "0" as the selection signal because frequency synchronization between the feedback clock from the GVCO 62 and the data signal delayed by the delay circuit 64 has not been established yet. Moreover, when the control signal cal is "0", the delay adjustment circuit 65 stops the delay adjustment operation and holds the delay code that has been set for the delay circuit 64 during the above-described delay adjustment. Therefore, the delay amount of the delay circuit 64 is fixed.

The edge detection circuit 61 outputs a reset signal ("0") upon detection of an edge of the data signal. Due to the above-described selection signal, the selector 73 outputs the reset signal that is supplied from the edge detection circuit 61. At this time, the output signal of the NAND circuit 88 of the GVCO 62 becomes "1", the GVCO 62 is reset, and the recovered clock output from the GVCO 62 rises to "1".

Note that, a timing when the GVCO 62 is reset and the recovered clock becomes "1" is delayed from a timing of an actual transition timing of the data signal, due to a delay caused by a path including the edge detection circuit 61, the selector 73, the NAND circuit 88, and the like. In the reception circuit 51 of the second embodiment, a data signal delayed by the delay circuit 64 whose delay amount is set taking into consideration the delay caused by the above-described path is input to the determination unit 70.

Thus, a transition timing of the data signal input to the determination unit 70 may be accurately synchronized with a timing when the recovered clock becomes "1".

The determination unit 70 compares the value of the data signal with a predetermined threshold value at a timing when the recovered clock rises, and outputs data corresponding to this comparison result. The recovered clock and the data output from the determination unit 70 are input to the logic circuit 52, where a predetermined operation is performed.

During the initial operation, the recovered clock output from the GVCO 62 is input to the phase detection circuit 66 as the feedback clock. Moreover, the data signal delayed by the delay circuit 64 is input to the phase detection circuit 66. Then, the phase detection circuit 66 detects a phase difference between the delay-adjusted data signal and the feedback clock from the GVCO 62. The charge pump 67 generates an analog output current in an amount corresponding to this phase difference, and the loop filter 68 generates a control voltage. The GVCO 62 varies the oscillation frequency in response to the control voltage.

During the initial operation, the frequency synchronization detection unit 69 determines whether the phase of the feedback clock coincides with the phase of the delay-adjusted data signal (whether the synchronization has been established) from the control voltage output from the loop filter 68. The frequency synchronization detection unit 69, when determining that the synchronization has been established, sets the selection signal to "1".

(Normal Operation)

Figure 9:
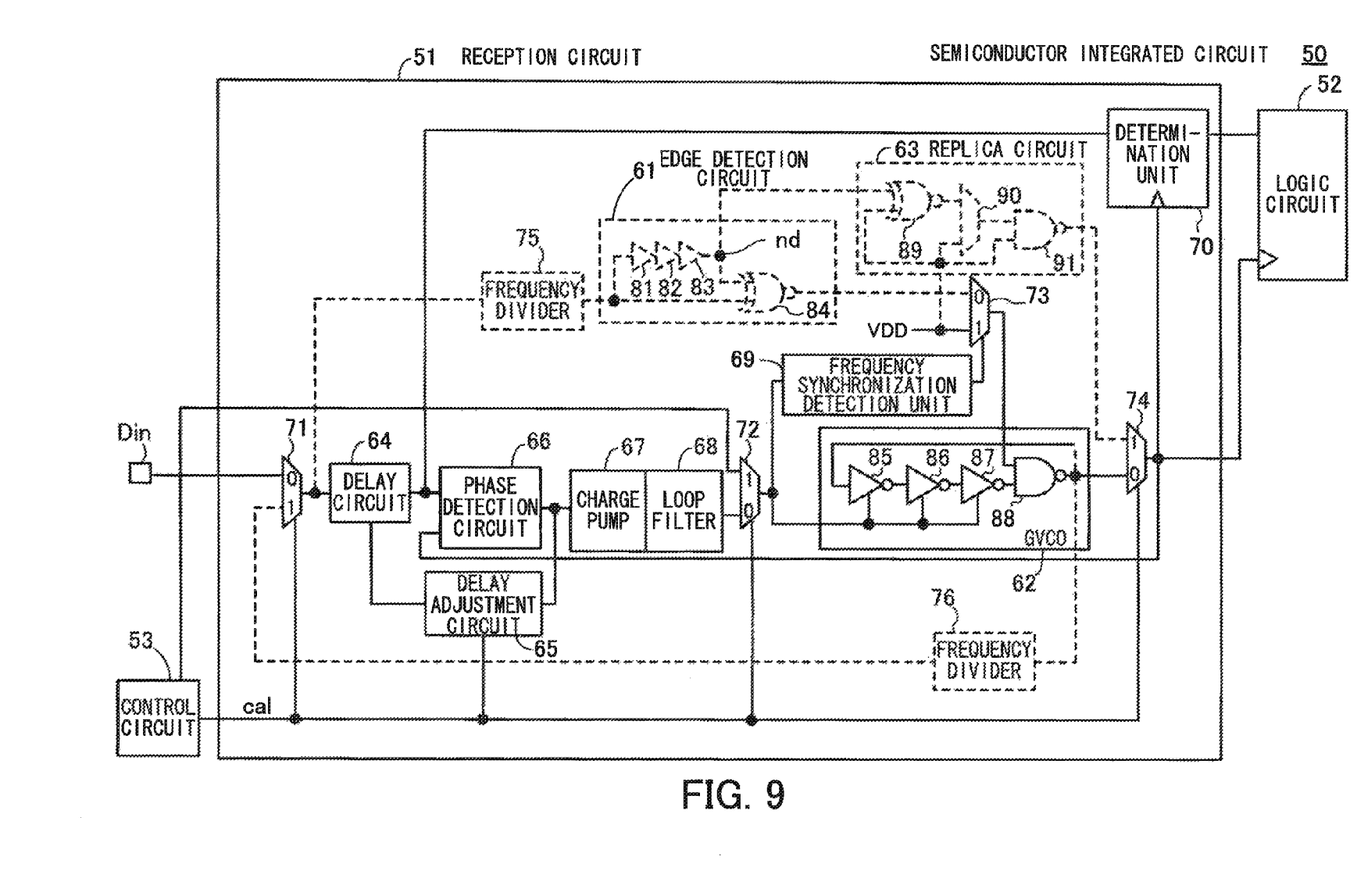
FIG. 9 illustrates an example of a normal operation.

FIG. 9 illustrates an example of the normal operation. In FIG. 9, elements or paths, which are not used (which are not selected) in the normal operation in the reception circuit 51 illustrated in FIG. 2, are indicated by a dashed line.

When the selection signal output from the frequency synchronization detection unit 69 becomes "1" the selector 73 will output the power supply voltage VDD, so that the output of the edge detection circuit 61 is invalidated. That is, the operation of the burst mode CDR using the edge detection circuit 61 is stopped, and the normal operation by the PLL-based CDR is performed. During the normal operation by the PLL-based CDR, the phase detection circuit 66 detects a phase difference between the delay-adjusted data signal and the feedback clock from the GVCO 62. The charge pump 67 generates an analog output current in an amount corresponding to this phase difference, and the loop filter 68 generates a control voltage. The GVCO 62 varies the oscillation frequency in response to the control voltage. The recovered clock output from the GVCO 62 is supplied to the determination unit 70 and the logic circuit 52 via the selector 74. The determination unit 70 compares the value of a data signal with a predetermined threshold value at a timing when the recovered clock rises, and outputs data corresponding to this comparison result. The recovered clock and the data output from the determination unit 70 are input to the logic circuit 52, where a predetermined operation is performed.

In this manner, the reception circuit performs clock recovery by means of the PLL-based CDR using the phase-adjusted data signal so as to coincide with the phase of the clock output from the GVCO 62 that is reset by means of the burst mode CDR using the edge detection circuit 61 and the GVCO 62. Thus, a tracking error in transitioning from the processing of the burst mode CDR to the processing of the PLL-based CDR may be eliminated.

Moreover, at the beginning, by recovering the clock by the burst mode CDR, it is possible to shorten the lock time, and subsequently by recovering the clock by the PLL-based CDR, it is possible to suppress also the effect of jitter. Thus, the occurrence of out-of-synchronization in the logic circuit 52 at the subsequent stage may be prevented. Therefore, the CDR operable at a high data rate may be realized.

Moreover, by providing the frequency synchronization detection unit 69, and by stopping the operation of the burst mode CDR when the frequency synchronization has been established by the PLL-based CDR, it is possible to reduce the power consumption of the reception circuit 51. Note that, instead of the frequency synchronization detection unit 69, a circuit may be provided, for example, which stops the operation of the burst mode CDR after a predetermined time.

Note that, in the above-described embodiments, the control circuit 53 is provided outside the reception circuit 51, but the control circuit 53 may be inside the reception circuit.

According to the reception circuit and the semiconductor integrated circuit of the disclosure, the occurrence of a tracking error may be suppressed.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:
1. A reception circuit comprising:
 a first clock recovery circuit that detects an edge from a data signal superimposed with a clock and generates a recovered clock by means of a voltage controlled oscillator whose oscillation operation is reset based on a timing when the edge is detected;

a phase adjustment circuit that adjusts a phase of the data signal so as to coincide with a phase of the recovered clock;

a second clock recovery circuit that, based on a phase difference between the data signal whose phase has been adjusted by the phase adjustment circuit and a feedback clock from the voltage controlled oscillator, adjusts an oscillation frequency of the recovered clock by means of the voltage controlled oscillator; and a determination circuit that determines a value of the data signal, whose phase has been adjusted by the phase adjustment circuit, at a timing when a signal level of the recovered clock transitions;

wherein the phase adjustment circuit adjusts the phase of the data signal by delaying the data signal based on a delay amount in the first clock recovery circuit.

2. The reception circuit according to claim 1, further comprising:

a loop filter that generates a control voltage with respect to the voltage controlled oscillator based on the phase difference; and a frequency synchronization detection circuit that, from a fluctuation amount in the control voltage, detects whether or not the data signal whose phase has been adjusted by the phase adjustment circuit is frequency-synchronized with the recovered clock, wherein the frequency synchronization detection circuit, upon detection of the frequency synchronization, stops an operation to reset the voltage controlled oscillator performed by the first clock recovery circuit.

3. A semiconductor integrated circuit comprising:

a reception circuit including:

a first clock recovery circuit that detects an edge from a data signal superimposed with a clock and generates a recovered clock by means of a voltage controlled oscillator whose oscillation operation is reset based on a timing when the edge is detected;

a phase adjustment circuit that adjusts a phase of the data signal so as to coincide with a phase of the recovered clock;

a second clock recovery circuit that, based on a phase difference between the data signal whose phase has been adjusted by the phase adjustment circuit and a feedback clock from the voltage controlled oscillator, adjusts an oscillation frequency of the recovered clock by means of the voltage controlled oscillator; and a determination circuit that determines a value of the data signal, whose phase has been adjusted by the phase adjustment circuit, at a timing when a signal level of the recovered clock transitions; and a logic circuit that, at the timing when the signal level of the recovered clock transitions, captures the value determined by the determination circuit and performs a predetermined operation;

wherein the phase adjustment circuit adjusts the phase of the data signal by delaying the data signal based on a delay amount in the first clock recovery circuit.

* * * * *